(12) United States Patent
Templeton et al.

(10) Patent No.: US 6,667,917 B1
(45) Date of Patent: Dec. 23, 2003

(54) SYSTEM AND METHOD FOR IDENTIFICATION OF FAULTY OR WEAK MEMORY CELLS UNDER SIMULATED EXTREME OPERATING CONDITIONS

(75) Inventors: Mark Templeton, Los Altos, CA (US); Dhrumil Gandhi, Cupertino, CA (US)

(73) Assignee: Artisan Components, Inc., Sunnyvale, CA (US)

( * ) Notice: Subject to any disclaimer, the term of this patent is extended or adjusted under 35 U.S.C. 154(b) by 0 days.

(21) Appl. No.: 10/077,837

(22) Filed: Feb. 15, 2002

Related U.S. Application Data
(60) Provisional application No. 60/298,346, filed on Jun. 15, 2001.

(51) Int. Cl.[7] .............................................. G11C 7/00
(52) U.S. Cl. ....................................... 365/201; 365/233
(58) Field of Search .................................. 365/201, 233

(56) References Cited

U.S. PATENT DOCUMENTS 5,712,584 A * 1/1998 McClure ..................... 327/198
5,828,258 A 10/1998 Ooishi et al. ................ 327/291
5,939,914 A * 8/1999 McClure ..................... 327/198

* cited by examiner

Primary Examiner—Vu A. Le
(74) Attorney, Agent, or Firm—Martine & Penilla, LLP

(57) ABSTRACT

A method for identifying faulty and weak memory cells is provided. A normal internal clock signal for use in accessing a memory array is provided, wherein the memory array may contain redundant memory cells that can be accessed during normal operation. In addition, a test is performed on the memory array using a stress clock signal. Each pulse of the stress clock signal is of a shorter duration than each pulse of the normal internal clock signal. In this manner, memory cells that fail the test using the stress clock signal are identified as non-usable memory cells. In some embodiments, the normal internal clock signal is based on required read and write times for the memory cells of the memory array and a margin added to the required read and write times. Each pulse of the stress clock signal can be approximately equal to each pulse of the normal internal clock signal minus the margin.

21 Claims, 7 Drawing Sheets

SYSTEM AND METHOD FOR IDENTIFICATION OF FAULTY OR WEAK MEMORY CELLS UNDER SIMULATED EXTREME OPERATING CONDITIONS

CROSS REFERENCE TO RELATED APPLICATIONS

This application claims the benefit of U.S. Provisional Patent Application having Ser. No. 60/298,346, filed on Jun. 15, 2001, entitled "System and Method for Identification of Faulty or Weak Memory Cells under Simulated Extreme Operating Conditions," which is hereby incorporated by reference.

BACKGROUND OF THE INVENTION

1. Field of the Invention

This invention relates generally to computer memory, and more particularly to systems and methods for identification of faulty or weak memory cells.

2. Description of the Related Art

In the semiconductor industry, embedded memories have become enormously popular as a critical part of Large Scale and Very Large Scale integrated circuits (ICs). Embedded memories allow custom or semi-custom design of ICs that implement part or whole of a system on a chip (SOC), which helps reduce the total component count and manufacturing costs. These ICs also usually employ libraries of "standard cells" as building blocks to construct the desired logic circuits. Standard cells include commonly used logic functions, such as NOR, NAND, INVERT, and further may also include decoders, registers, counters, and other more complex components.

FIG. 1 is a diagram showing a conventional embedded memory used in IC designs 100. The memory core includes a memory array 102 having a plurality of memory bit cells 110. The memory bit cells 110 perform the main function of storing the data in the form of binary logic values of "0" or "1". Further included is x-decode circuitry 104, y-decode circuitry 106, sense amplifier circuitry 109, I/O circuitry 113, and control circuitry 108. The x-decode circuitry 104 and the y-decode circuitry 106 provide the ability to select or access a specific memory cell 110 based on encoded address location provided as input to the embedded memory. The sense amplifier circuitry 109 and the I/O circuitry 113 enable faster access to the selected memory cell 110. The control circuitry 108 controls the function and timing of the decode circuitry 104/106, sense amp circuitry 109, and the I/O circuitry 113 by generating internal timing pulses, buffering external input signals and clocks and defining the action to be performed on the memory bit cell. For example, in case of a RAM the action could be a read or a write.

The memory array 102 is generally organized in a two-dimensional array, wherein the memory cells 110 are addressed at the intersection of rows, or "word lines," and columns, or "bit lines," of the memory array 102. To access a given memory cell 110, it is necessary to select the word line and the bit line at the intersection where the memory element is located. For this purpose, memory addresses are divided into row and column address signals, which are decoded independently using the x-decode circuitry 104 and the y-decode circuitry 106.

The memory core 100 can include single or multiple configurable memory arrays 102 with identical numbers of rows and columns. Embedded memories are typically designed to provide access to multiple cells 110 in a row in parallel during the same cycle, which is typically defined by the primary clock signal input for the memory. In this case, a plurality of column lines can be grouped together to form an I/O (input/output) memory block array whose column lines are multiplexed into a single I/O by dedicated Y-decode 106, Sense Amp 109 and I/O 113 circuits. A Memory I/O block then includes the cell array and corresponding Y-decode, Sense Amp and I/O circuitry that will provide access to one single cell 110 per access cycle. In such instance, the memory array 102 contains rows of memory cells 110 that are accessed by activation of the row word line. Groups of these cells are multiplexed into one output, and each such output is accessed concurrently with all the others during the same cycle. Each intersecting point between a row (word line) and an I/O memory block represents the group of memory cells 110, only one of which is accessed at the I/O pin during a cycle. The collection of these cells in FIG. 1 form a memory macro unit. One or more of such memory units are used as the principle building block for implementing storage elements on a custom or semi-custom IC or SOC chip.

Although IC Manufacturers strive to produce chips with minimum defects, as a practical matter, defects do occur for various reasons. Such causes can happen during the manufacturing process, such as when random particles of dust settle on the surface of a silicon wafer during processing. Embedded memories are increasingly susceptible to such defects as the density and quantity of memory on ICs increases. The impact of defect within the embedded memories on the overall yield, or the ratio of good parts to total parts, has increased significantly. Since a single defect in a single memory cell can render the whole IC or SOC unusable, techniques to repair such defects by use of extra storage cells have been implemented to improve the overall yield and hence reduce the cost of the IC.

The memory core 100 of FIG. 1 shows three faulty or weak memory cells 112. The memory cells 110 that fail to store or retain the correct data altogether are considered faulty or "hard" errors. The memory cells 110 that fail to present correct data in expected time are considered weak or "soft" errors. Weak cells are also memory cells 110 whose performance degrades sufficiently in response to the operating environment such that the memory cells 110 fail to present correct data in expected time.

Such a weak or faulty cell can be caused, for example, by the degradation of the devices, transistors, metal or other bridging defects, defective devices in the cell, or other reasons. Degradation of the devices in the cell can occur from extended use of the memory cell that is coupled with an imperfectly manufactured device. Bridging defects can occur during the semiconductor fabrication process from minor, localized variation in the processing steps like metal deposition or etching. Defective devices in the cell can be the result of undesirable particles that settle onto a semiconductor layer. A single memory cell failure will cause the entire IC or SOC chip to malfunction, and render the chip unusable, unless the defective memory cell can be repaired or replaced to ensure proper functioning of the IC or SOC chip.

Another difficulty arises from packing higher-density building blocks into an IC or SOC chip. Large memory blocks contain a multitude of row memory lines intersecting I/O memory blocks. As a memory array increases in size, the number of correctly functioning memory arrays decreases proportionally, caused by the increasing likelihood of locating memory cell defects within the larger memory array. In order to produce such IC or SOC with large memories while maintaining cost control, some methodology of redundant storage that can be used to repair the defective memories is desirable.

Laser fuse based or other "wired" in repair methods, and built-in self-repair (BISR) methods have been used to repair faulty and weak memory cells via redundant storage elements. Memory cells 112 that prove defective during testing of the memory are replaced by the redundant memory storage elements. Redundancy and repair circuits typically include either laser programmable fuses or other memory elements suitable to store those address configurations that correspond to the defective memory elements and need to be replaced.

Laser programmable fuses have several disadvantages including requiring significant testing and laser programming manufacturing infrastructure. Furthermore, laser programmable fuses are large due to guard ring and other requirements imposed by the laser repair machines. Laser fuse programming does not work correctly 100% of the time, causing additional yield loss. Further, laser programmable fuses must be programmed prior to packaging and therefore all the defects must be identified prior to repair. Identification of the weak cells requires significant additional testing due to their environment dependent nature.

BISR systems use similar approaches. In case of BISR, the circuitry to perform all of the functions is embedded onto the same IC, SOC, or on the same system board, as the memory that may need to be repaired. When these functions are placed outside the IC at the system board level, access to appropriate elements on the IC is provided through pins to perform the repair operation.

A BISR includes a built in self-test (BIST) component that allows testing of the target memories to identify faulty locations. The BISR is typically executed when the IC, SOC, or the system board is first powered up, or upon a top-level reset. During the self test, test patterns are generated by a data generator within the BIST and the data is written to and read from all of the locations in the memory under the control of the BIST. The BIST also has address generators that generate addresses in a way to test all the cells in the memory.

A comparator compares data read from the memory array with data expected from the data generator and, if there is a mismatch, the faulty address is stored into a register in an encoded form. After the entire memory is tested, the BISR circuitry determines if there is sufficient redundant storage available to repair all the faulty locations, and generates a flag signal to indicate that the memory is OK. If the flag indicates failure to repair during the factory testing of the part, the part can be discarded. When the part is qualified, it is put in the system and shipped to customers. Once the part or the system is shipped to the customer, the flag indicating memory is OK is not used. The BISR circuits, on the other hand, continue to perform the self-repair operation every time the system is powered up in the field.

During memory access operations, the faulty addresses stored in the fault register block are used to divert (or redirect) an access to a faulty address to a non-faulty redundant address. A memory access address is compared to the contents of the fault register data and, if a match occurs, the access is redirected to the appropriate redundant address. Redirection is provided by the redundancy control block within BISR that supplies an appropriate redundant address to the embedded memory.

Although BISR provides repair functionality without requiring laser fuses, problems can occur when the memory is used under conditions different than were present during the BISR testing during chip power up or reset. Specifically, the tests performed on the memory core during the BISR process may not adequately cover what can occur once the IC or SOC starts operating in it's normal mode after BISR, such as when a memory cell is "weak."

A weak memory cell may function properly during BISR testing during chip or system power up or reset, however, when operating conditions change, such as the operating temperature or voltage, a weak memory cell may start failing. It is very common for the temperature of an IC or SOC to increase significantly after the initial power up or reset. Thus, a conventional BIST or BISR can easily detect a memory cell that is faulty because the cell cannot be read or written to during the testing operation.

However, a weak memory may not be detected by a conventional BIST or BISR system because a weak memory cell will function normally during the testing that occurs under the less stressful conditions that usually exist during power up or reset. Unfortunately, if the system having one or more weak memory cells was repaired by the conventional BISR during the power up or reset step, there is a potential for the weak cells to start failing once the operating conditions change, for example, by an increase in the temperature of the IC or the system board. This will cause the entire system to fail as the system is expecting a correctly functioning memory after BISR. Such system failures are usually not acceptable to the users of the system. As a result, the use of BISR to repair embedded memories is severely limited.

In view of the forgoing, there is a need for improved memory testing methods. The methods should reduce the effect of weak memory cell failure after burn-in. Further, the methods should allow simulation of extreme operating conditions without extensive environmental tests including tests under higher than normal voltages and temperatures. This will benefit both testing during production and for BISR operation.

SUMMARY OF THE INVENTION

Broadly speaking, the present invention fills these needs by providing a testing system that uses a stress clock signal having a decreased pulse width, which simulates extreme operating conditions and allows detection of both faulty memory cells and weak memory cells. In one embodiment, a method for identifying faulty and weak memory cells is disclosed. A normal internal clock signal for use in accessing a memory array is provided, wherein the memory array may contain redundant memory cells that can be accessed during normal operation. In addition, a test is performed on the memory array using a stress clock signal. Each pulse of the stress clock signal is of a shorter duration than each pulse of the normal internal clock signal. In this manner, memory cells that fail the test using the stress clock signal are identified as non-usable memory cells. In some embodiments, the normal internal clock signal is based on required read and write times for the memory cells of the memory array and a margin added to the required read and write times. The amount of optimal margin can be derived from the expected variations in the required read and write times for the memory cells of the memory array due to possible variations in environmental conditions, operating conditions and other factors. Each pulse of the stress clock signal can be approximately equal to each pulse of the normal internal clock signal minus the margin. Preferably, the stress clock signal is not used during normal memory access operations, while the normal internal clock signal is used during normal memory access operations.

In another embodiment, a method for identifying faulty functional logic is disclosed. Similar to above, an normal clock signal for use in accessing functional logic is provided, where the functional logic has access to redundant functional logic during normal operation. In addition, a test is performed on the functional logic using a stress clock signal, where each pulse of the stress clock signal is of a shorter duration than each pulse of the normal clock signal. In this manner, functional logic elements that fail the test using the stress clock signal are identified as non-usable functional logic elements.

In further embodiment, an embedded memory device is disclosed. The embedded memory device includes a memory array may contain redundant memory cells that can be accessed during normal operation, and a programmable normal internal clock. The programmable normal internal clock can be programmed to generate a stress clock signal, wherein each pulse of the stress clock signal is of a shorter duration than each pulse of a normal normal internal clock signal used in accessing the memory array. Also included in the embedded memory device is a built-in self-test circuit that performs a built-in self-test using the stress clock signal. In this manner, extreme operating conditions are simulated by the stress signal. Optionally, the embedded memory device can include a storage, such as a register, that stores defective memory addresses detected by the built-in self-test circuit. Further, redundant control logic can be included that redirects memory access operations to the defective memory addresses to redundant memory cells.

A method for testing a memory under simulated extreme conditions is disclosed in another embodiment of the present invention. A normal internal clock signal is provided for use in accessing a memory array, wherein the memory array may contain redundant memory cells that can be accessed during normal operation. In addition, the memory array is tested using a stress signal having a pulse width that is shorter than a pulse width of the normal internal clock signal, and memory cells that fail the test using the stress signal are recorded as non-usable memory cells. In this manner, extreme operating conditions are simulated by the stress signal. As above, the normal internal clock signal can be based on required read and write times for memory cells of the memory array, and on a margin added to the required read and write times for memory cells of the memory array. Further, each pulse of the stress clock signal can be approximately equal to each pulse of the normal internal clock signal minus the margin.

Advantageously, the embodiments of the present invention are capable of detecting weak memory cells via the stress clock signal. Further, the embodiments of the present invention can be used to simulate extreme operating conditions that may occur in field use via the stress clock signal. The stress clock signal can mimic the effects of variables such as temperature and voltage. Hence, time can be saved using the embodiments of the present invention since variances in variables such as temperature and voltage can be simulated using the stress clock signal instead of actually altering the individual test variables.

Moreover, the embodiments of the present invention can utilize the stress clock signal to perform a high stress BIST or BISR upon the ASIC memory during power up or reset of the ASIC. In particular, during power up or reset of the ASIC, the BISR system tests the memory core using the stress clock signal, which facilitates discovery of weak memory cells as well as faulty memory cells.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for a testing system that uses a stress clock signal having a decreased pulse width, which simulates extreme operating conditions and allows detection of both faulty memory cells and weak memory cells. To this end, the embodiments of the present invention provide testing systems that test components of an ASIC, which can be memory cells or functional logic, at a high stress level to discover weak memory cells, as well as faulty memory cells and functional logic under simulated extreme conditions. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
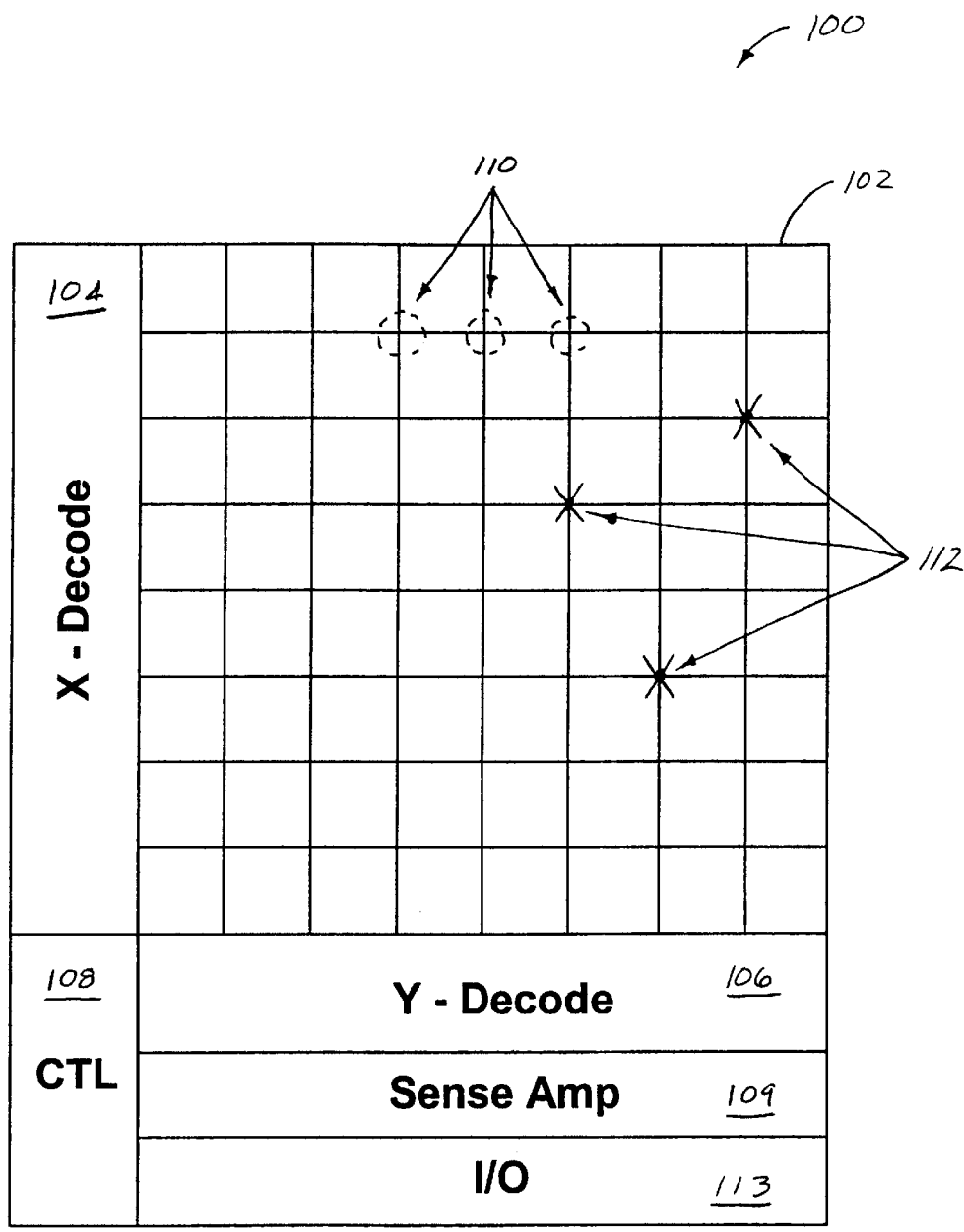
FIG. 1 is a diagram showing a conventional memory core.
Figure 2A:
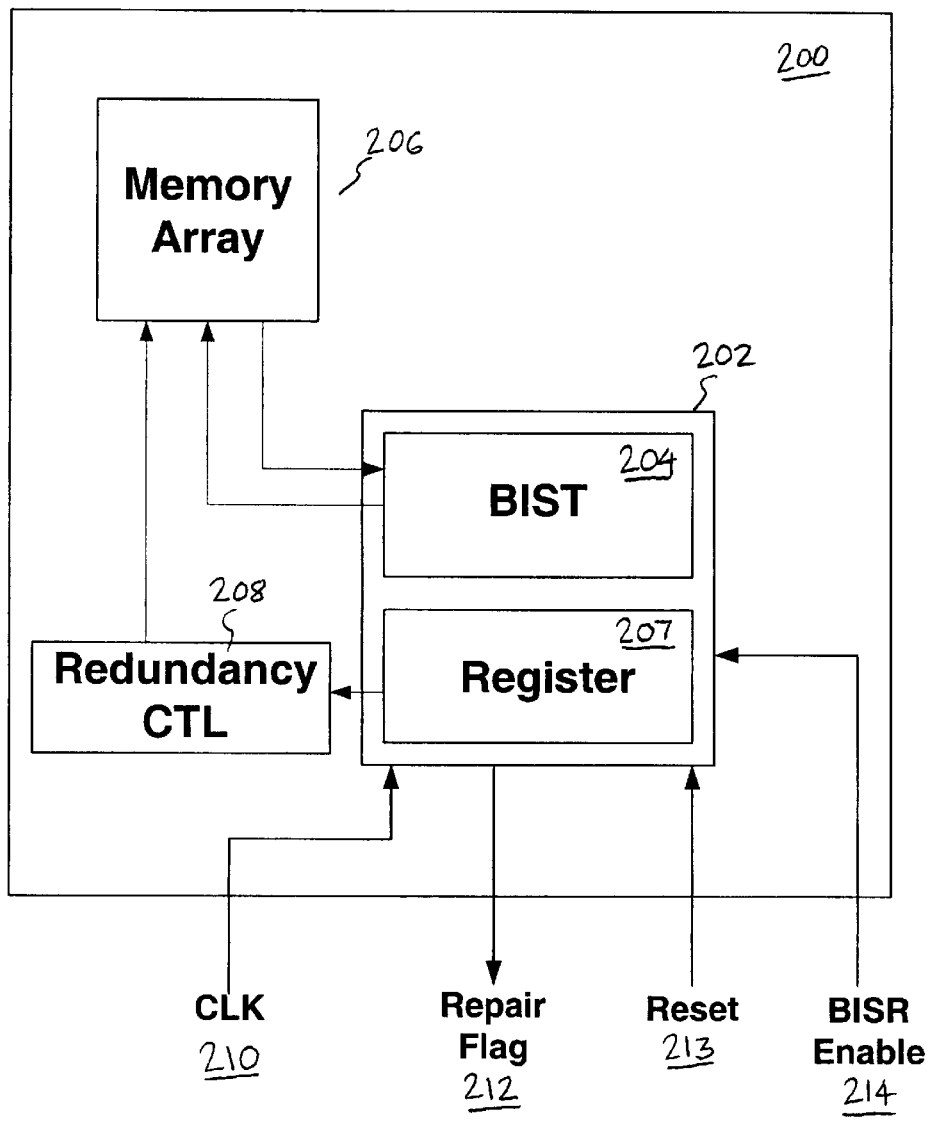
FIG. 2A is a block diagram showing built-in self-repair that incorporates high stress test capability for identifying weak cells, in accordance with an embodiment of the present invention.

FIG. 1 has been described in terms of the prior art. FIG. 2A is a block diagram of embedded memory system 200 with high stress built-in self-repair, in accordance with an embodiment of the present invention. The memory system 200 can be implemented entirely on one IC or SOC, or on a system board. The entire memory system 200 includes a high stress built-in self-repair (BISR) system 202 having a built-in self-test (BIST) circuit 204, a register 207, and redundant control logic 208.

The high stress BISR system 202 is used to self-repair the embedded memory 206, which is enhanced for high stress testing. A clock 210 is provided to the high stress BISR system 202 and the embedded, enhanced memory 206. The high stress BISR system 202 is also supplied with a reset 213, and a BISR enable signal 214. Further, a repair flag 212 is provided as output from the high stress BISR system 202. The memory array 206 of the ASIC 200 includes redundant memory cells, which are used as replacements for memory cells that prove defective during testing of the memory device. It should be noted that the redundant memory cells can be located either within the memory array 206, or at another location on the ASIC that is outside the memory array 206. In some embodiments, the redundant memory can be present at a location other than on the ASIC 200.

The high stress BISR system 202 provides high stress testing of the memory array 206, which allows the embodiments of the present invention to discover weak memory cells, as well as faulty memory cells. During operation, the BIST circuit 204 tests the memory array 206 in a high stress mode that determines whether the each memory cell of the memory array will operate under varying field conditions. In particular, the BIST circuit 204 outputs various control signals, address, and data for performing BIST on the memory array 206.

Further, the BIST circuit 204 receives output data from an output terminal of the memory array 206, determines whether any memory cells of the memory array 206 are faulty, and outputs the result of the determination to the register 207. As a result, the BIST circuit 204 can test whether any memory cell included in the memory array 206 is faulty, by the aforementioned operation.

The BIST circuit 204 further determines whether any of the faulty and weak memory cells discovered during the stress testing are repairable, and outputs the result using the repair flag 212. The repair flag 212 indicates whether the memory passed or failed. A pass result can indicate either that there are no faulty or weak memory cells present, or that faulty or weak memory cells are present but are reparable using the redundant memory cells. A fail result indicates that faulty or weak memory cells are present that are not reparable using the redundant memory cells.

When repairable memory cells are present, the register 207 in conjunction with the redundant control logic 208 facilitates the re-routing of data to redundant memory cells. Essentially, for each discovered faulty or weak memory cell, the register 207 records the location of the faulty or weak memory cell and provides that information to the redundant control logic 208, which facilitates re-routing of access to the faulty or weak memory cell.

During memory access operations, the faulty addresses stored in the register 207 are used to redirect an access to a faulty address to a non-faulty redundant address. A memory access address is compared to contents of the register 207 and, if a match occurs, the access is redirected to a redundant address. Redirection is provided by redundant control logic 208 that supplies a corrected address to the address decoder, which in turn addresses into a memory array 206. As previously mentioned, the high stress BISR system 202 provides high stress testing of the memory array 206 that allows the embodiments of the present invention to discover weak memory cells, as well as faulty memory cells, discussed in greater detail subsequently with respect to FIG. 3.

Figure 2B:
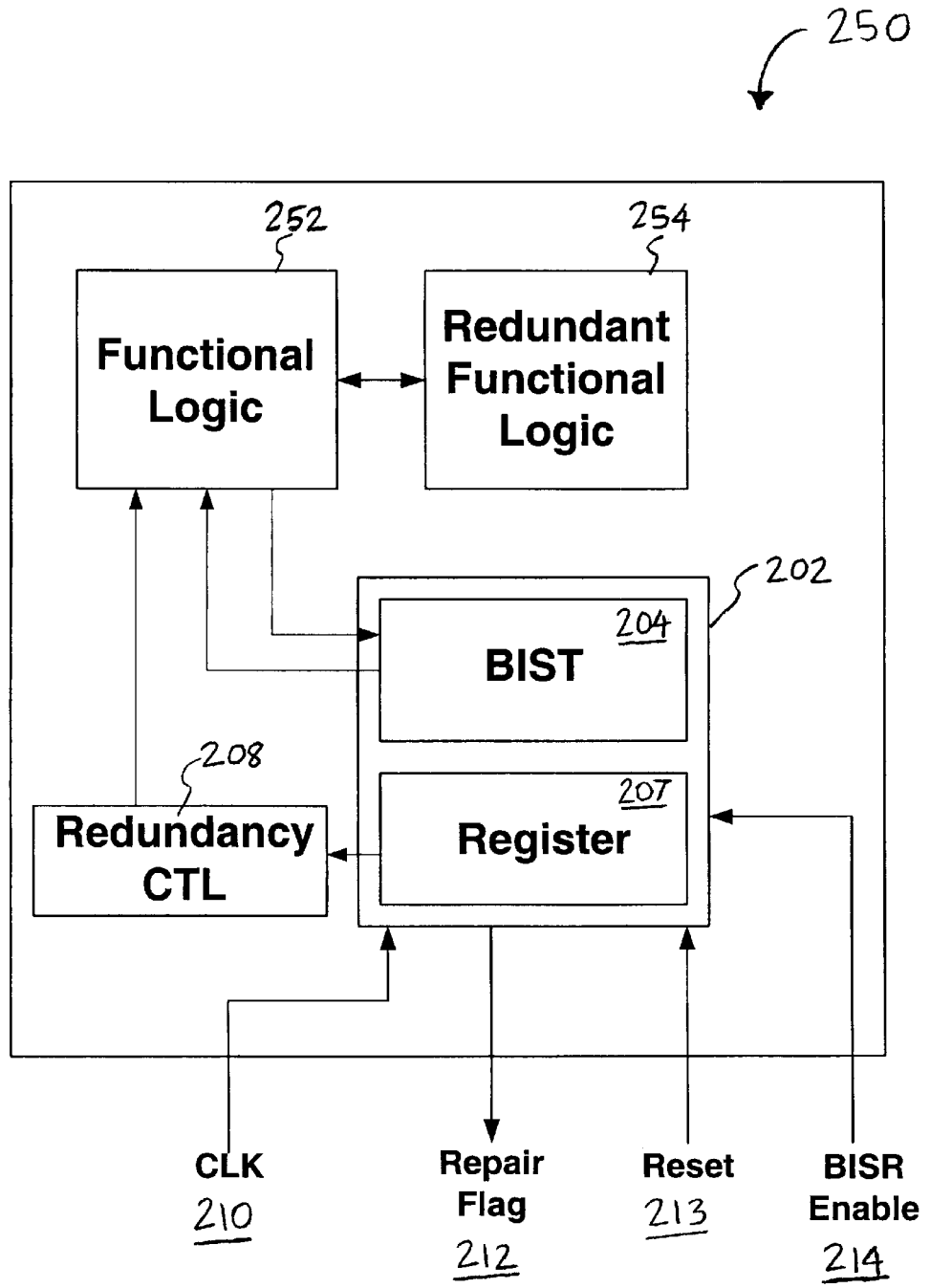
FIG. 2B is a block diagram showing an ASIC having high stress built-in self-repair for functional logic, in accordance with an embodiment of the present invention.

The high stress testing system of the embodiments of the present invention can also be used with functional logic elements, such as NOR, NAND, INVERT, where redundant functional logic is provided for repair of faulty functional logic elements. FIG. 2B is a block diagram showing an ASIC 250 having high stress built-in self-repair for functional logic, in accordance with an embodiment of the present invention. The ASIC 250 includes a high stress built-in self-repair (BISR) system 202 having a built-in self-test (BIST) circuit 204 and a register 207. Coupled to the high stress BISR system 202 are functional logic 252 in communication with redundant functional logic 254, and redundant control logic 208. A clock 210 is provided to the high stress BISR system 202, as well as a reset 213, and a BISR enable signal 214. Further, a repair flag 212 is provided as output from the high stress BISR system 202.

In FIG. 2B, the redundant functional logic 254 can be used as replacements for functional logic elements that prove defective during testing of the device. It should be noted that the redundant function logic circuitry 254 can be located either within the functional logic 252, or at another location on the ASIC 250 that is outside the functional logic 252. In some embodiments, the redundant function logic circuitry 254 can be present at a location other than on the ASIC 250.

Similar to FIG. 2A, the high stress BISR system 202 of FIG. 2B provides high stress testing of the functional logic 252, which allows the embodiments of the present invention to discover faulty logic elements within the functional logic 252. During operation, the BIST circuit 204 tests the functional logic 252 in a high stress mode that determines whether the each faulty logic elements of the functional logic 252 will operate under varying field conditions.

Further, the BIST circuit 204 receives output data from an output terminal of the functional logic 252, determines whether any functional logic elements of the functional logic 252 are faulty, and outputs the result of the determination to the register 207. As a result, the BIST circuit 204 can test whether any functional logic element included in the functional logic 252 is faulty, by the aforementioned operation.

The BIST circuit 204 further determines whether any of the faulty functional logic elements discovered during the stress testing are repairable, and outputs the result using the repair flag 212. The repair flag 212 indicates whether the functional logic 252 passed or failed. A pass result can indicate either that there are no faulty functional logic elements present, or that faulty functional logic elements are present but are reparable using the redundant functional logic 254. A fail result indicates that faulty functional logic elements are present that are not reparable using the redundant memory cells.

When repairable functional logic elements are present, the register 207 in conjunction with the redundant control logic 208 facilitates the re-routing of data to redundant functional logic 254. Essentially, for each discovered faulty functional logic element, the register 207 records the location of the faulty functional logic element and provides that information to the redundant control logic 208, which facilitates re-routing of access to the faulty functional logic element.

Figure 3:
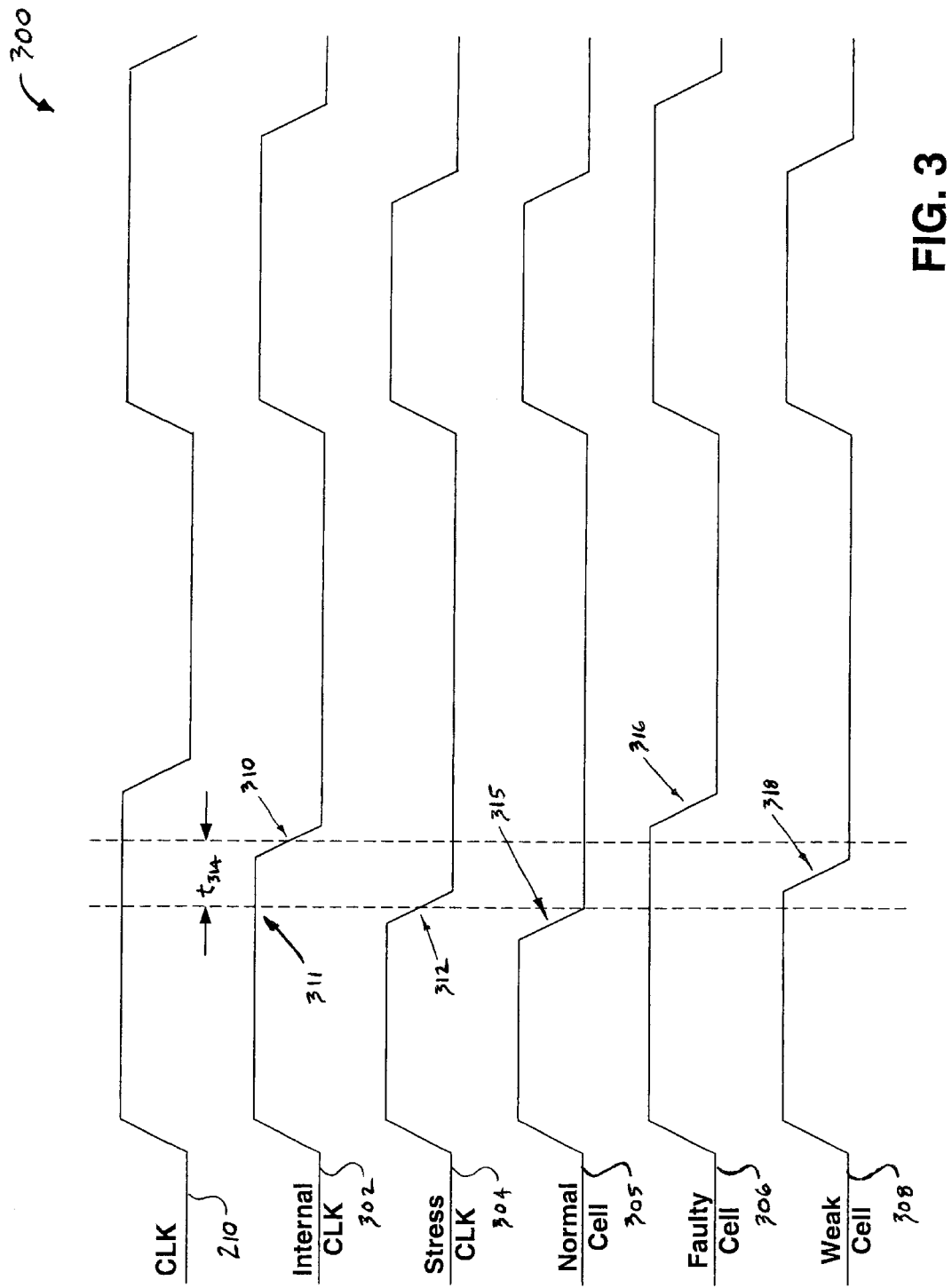
FIG. 3 is a signal diagram showing testing signals for a high stress BISR system, in accordance with an embodiment of the present invention.

FIG. 3 is a signal diagram showing testing signals 300 for a high stress BISR system, in accordance with an embodiment of the present invention. The testing signals 300 include the external clock signal 210, a normal internal clock signal 302, a stress clock signal 304, a faulty cell timing signal 306, and a weak cell timing signal 308. The external clock 210 is the global clock signal provided to the ASIC. The normal internal clock signal 302 is based on the required read and write times for the memory cells of the memory array. Specifically, each pulse of the normal internal clock signal 302 is designed to be of sufficient duration that allows a read or a write, which ever is longer, to be performed upon a memory cell. In addition, a margin is added to this time to allow for variances. Thus, each pulse of the normal internal clock signal 302 is approximately equal to the time required to perform a read or write operation to a memory cell plus a margin $t_{314}$, such as determined from expected variations in the required read or write time. The normal internal clock signal 302 is used during normal operation of the memory array.

The stress clock signal 304 is also based on the required read and write times for the memory cells of the memory array. However, unlike the normal internal clock signal 302, the stress clock signal 304 does not include the margin $t_{314}$. Thus, each pulse of the stress clock signal 304 is approximately equal to a pulse of the normal internal clock 302 minus the margin $t_{314}$. The embodiments of the present invention utilize the stress clock signal to perform a high stress BISR upon the ASIC memory during power up or reset of the ASIC. In particular, during power up or reset of the ASIC, the BISR system tests the memory core using the stress clock signal 304, which, as explained in greater detail subsequently, facilitates discovery of weak memory cells as well as faulty memory cells. Faulty and weak addresses discovered during the tests are stored in the register and are used by control logic to redirect accesses from the non-functional addresses to the spare, functional redundant addresses. As mentioned above, the redirection is provided by redundant control logic that supplies a corrected address to the address decoder, which in turn addresses into a memory array.

The faulty cell timing signal 306 represents the time required for a particular faulty memory cell to perform a read or a write. As shown in FIG. 3, the faulty cell 306 completes the read or write operation at point 316. However, point 316 occurs after point 310, which is the trailing edge of the normal internal clock 302. Thus, the faulty cell 306 will be detected regardless of whether the stress clock 304 or the normal internal clock 302 is used to perform the test. Conventional BISR and BIST circuits must rely on a signal such as the normal internal clock 302 to perform memory tests. This is true even when a conventional BISR or BIST uses increased stress voltage or other extreme environmental conditions to perform the tests. Hence, conventional BISR and BIST circuits are often able to detect normal faulty memory cells, such as sell 306. However, weak memory cells, such as cell 308 are not detected using conventional BISR or BIST techniques.

As shown in FIG. 3, the weak memory cell 308 completes a read or write at point 318, which occurs before point 310 on the normal internal clock 302. However, during operation in the field, variances in operating conditions can cause changes in the ASIC that effectively eliminate the margin $t_{314}$, thus requiring memory read and write operations to complete before point 311, which is approximately equal to point 310 minus the margin $t_{314}$. Under these conditions, the weak memory cell 308 will fail, since the weak memory cell 308 completes the read or write at point 318, which occurs after point 311 on the normal internal clock 302. Hence, conventional BISR and BIST circuits are not capable of detecting a weak memory cell such as weak cell 308 because conventional BISR and BIST circuits use a normal internal clock to perform memory tests.

Advantageously, the embodiments of the present invention are capable of detecting weak memory cells 308 via the stress clock signal 304. The embodiments of the present invention utilize the stress clock signal 304 to perform a high stress BISR upon the ASIC memory during power up or reset of the ASIC. In particular, during power up or reset of the ASIC, the BISR system tests the memory core using the stress clock signal 304, which facilitates discovery of weak memory cells 308 as well as faulty memory cells 306. Although the normal internal clock and stress clock signals have been discussed with respect to memory arrays, it should be noted that the normal internal clock and stress clock signals can also be used with the functional logic, shown in FIG. 2B The embodiments of the present invention will detect the weak memory cell 308 since the weak memory cell 308 completes a read or write at point 318, which occurs after the trailing edge, point 312, of the stress clock signal 304. Thus, by using the stress clock signal 304 to perform a BIST or BISR, the embodiments of the present invention are capable of detecting and repairing both faulty memory cells and weak memory cells. To provide both the normal internal clock signal 302 and the stress clock signal 304, embodiments of the present invention utilize a memory control circuit capable of providing both memory clock signals.

Figure 4:
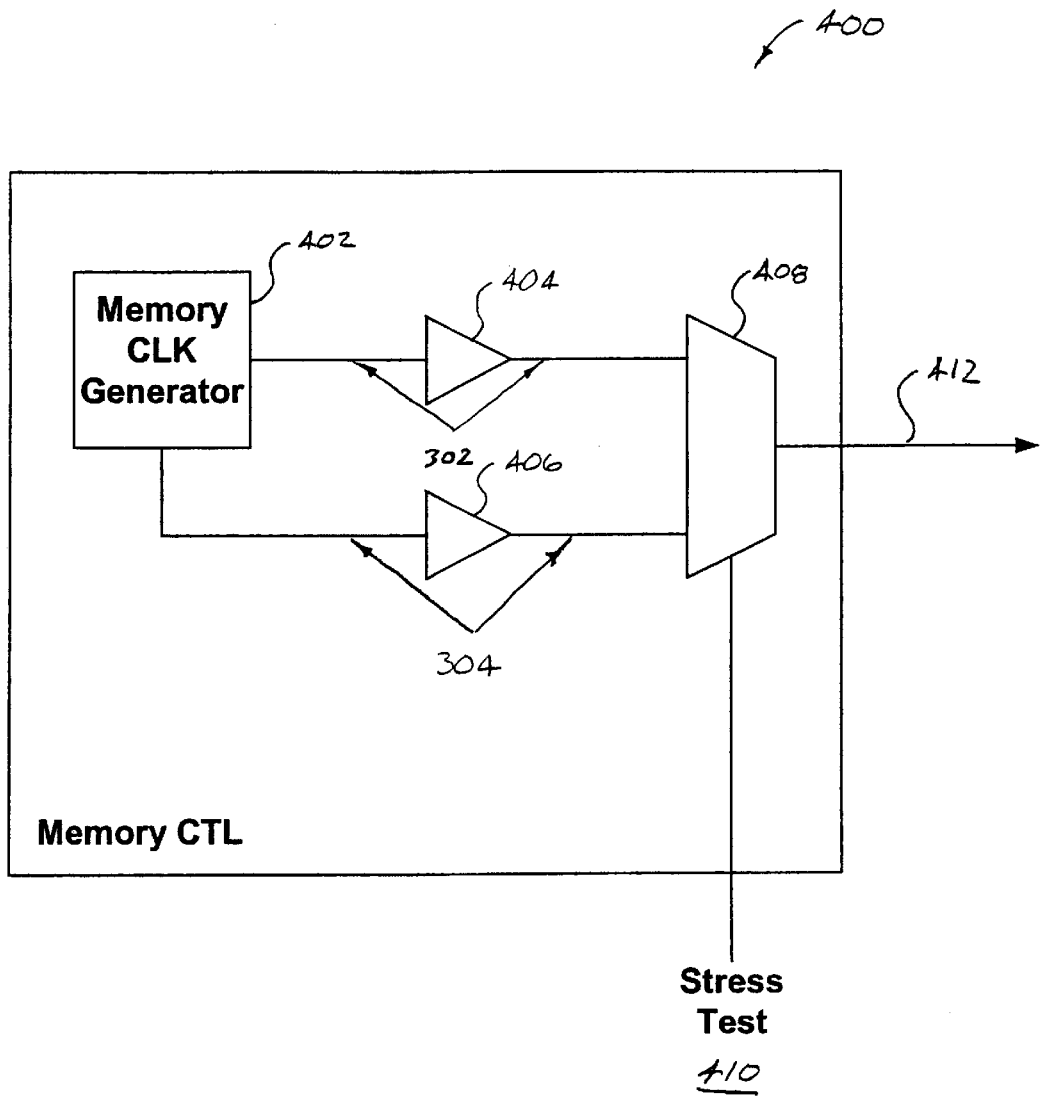
FIG. 4 is a block diagram showing a memory control circuit capable of providing both an normal internal clock signal and a stress clock signal, in accordance with an embodiment of the present invention.

FIG. 4 is a block diagram showing a memory control circuit 400 capable of providing an additional "stressed" internal timing signal 304 in addition to the normal internal timing signal 302, in accordance with an embodiment of the present invention. The memory control circuit 400 includes a memory clock generator 402 coupled to a multiplexer 408 via a first buffer 404 and a second buffer 406. The memory clock generator 402 is capable of providing a normal internal clock signal 302 to the multiplexer 408 via the first buffer 404, and a stress clock signal 304 to the multiplexer 408 via the second buffer 406.

In operation, the memory control circuit 400 provides either the normal internal clock signal 302 or the stress clock signal 304 to the memory core via output 412 based upon the state of stress test pin 410. Specifically, during power up or reset of the ASIC, the stress test pin 410 is set to select the stress clock signal 304 using the multiplexer 408. After testing and updating of the register, the stress test pin 410 is set to select the normal internal clock signal 302 for normal operation of the memory core. In this manner, the embodiments of the present invention can test the memory at higher stress levels during BISR and later operate under the normal internal clock signal during normal operation of the memory core.

Figure 5:
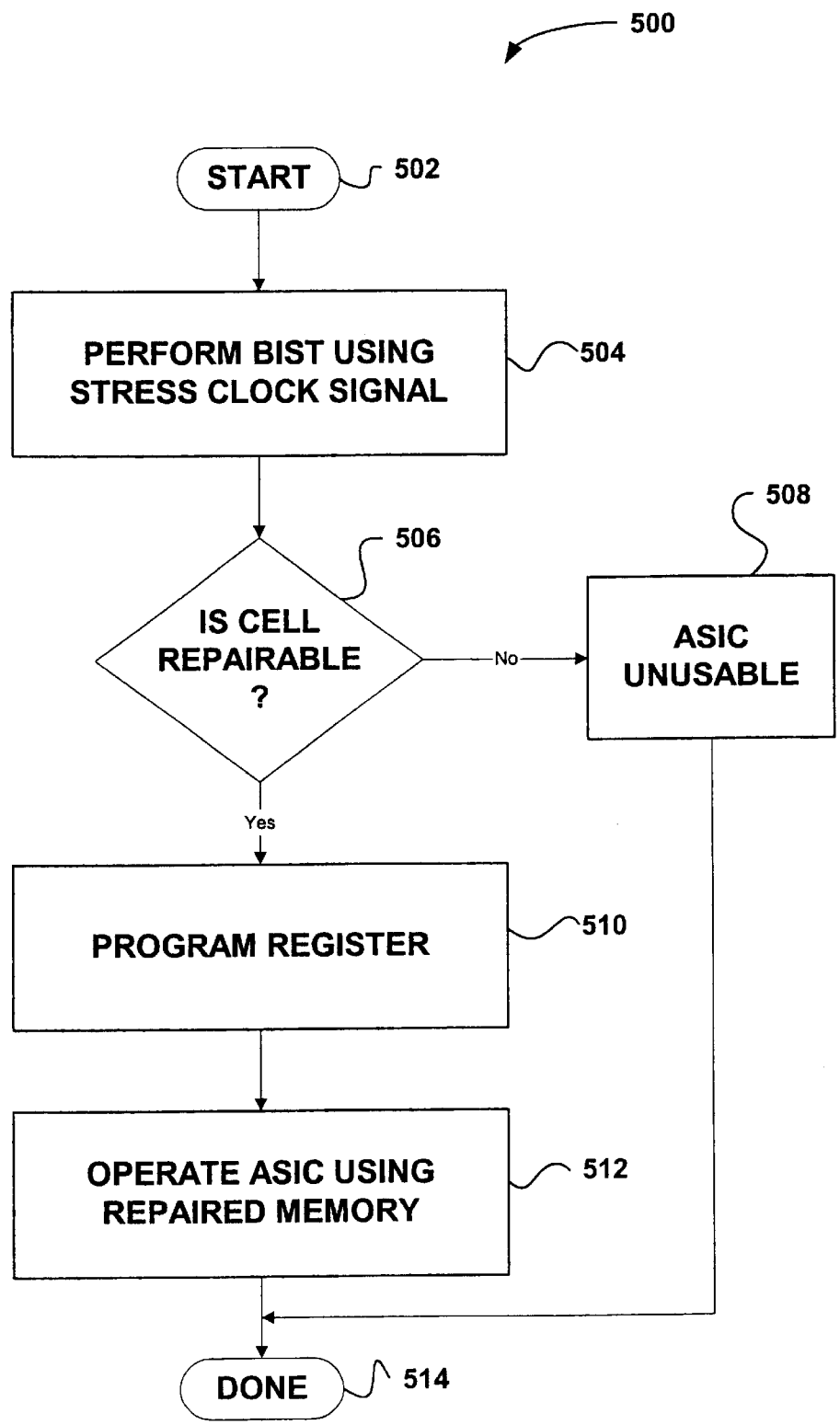
FIG. 5 is a flowchart showing a method for performing high stress built-in self-repair, in accordance with an embodiment of the present invention.

FIG. 5 is a flowchart showing a method 500 for performing high stress built-in self-repair, in accordance with an embodiment of the present invention. In an initial operation 502, preprocess operations are performed. Preprocess operations include determining a required pulse length for memory access, selecting test vectors for BIST, and other preprocess operations that will be apparent to those skilled in the art.

In a BIST operation 504, a BIST is performed using the stress clock signal. The BIST circuit tests the memory array in a high stress mode that determines whether the each memory cell of the memory array will operate under varying field conditions. In particular, the BIST circuit outputs various control signals, address, and data for performing BIST on the memory array. Further, the BIST circuit receives output data from an output terminal of the memory array, determines whether any memory cells of the memory array are faulty, and outputs the result of the determination to a register. As a result, the BIST circuit can test whether any memory cell included in the memory array is faulty.

The stress clock signal is based on the required read and write times for the memory cells of the memory array.

However, unlike the normal internal clock signal, the stress clock signal does not include a margin. Thus, each pulse of the stress clock signal is approximately equal to a pulse of the normal internal clock minus the margin. The embodiments of the present invention utilize the stress clock signal to perform a high stress BISR upon the ASIC memory during power up or reset of the ASIC. As mentioned above, testing the memory using the stress clock signal facilitates discovery of weak memory cells as well as faulty memory cells.

During operation in the field, variances in operating conditions can cause changes in an ASIC that effectively eliminate the margin, thus requiring memory read and write operations to complete faster than under normal operating conditions. Under these stress conditions, the weak memory cell will fail.

A decision is then made as to whether each faulty or weak memory cell is repairable, in operation 506. The BIST circuit determines whether any of the faulty and weak memory cells discovered during the stress testing are repairable, and outputs the result using the repair flag. The repair flag indicates whether the memory passed or failed. A pass result can indicate either that no faulty or weak memory cells present, or that faulty or weak memory cells are present but they are reparable using the redundant memory cells. A fail result indicates that faulty or weak memory cells are present that are not reparable using the redundant memory cells. If a particular memory cell is not repairable, the ASIC is declared unusable in operation 508. If all the faulty or weak memory cells are repairable, the method 500 continues with a register programming operation 510.

In the register programming operation 510, the BISR register is programmed with the faulty and weak cell locations. When repairable memory cells are present, the register in conjunction with the redundant control logic facilitates the re-routing of data to redundant memory cells. Essentially, for each discovered faulty or weak memory cell, the register records the location of the faulty or weak memory cell and provides that information to the redundant control logic, which facilitates re-routing of access to the faulty or weak memory cell.

The ASIC is then operated using the repaired memory, in operation 512. During memory access operations, the faulty addresses stored in the register are used to redirect an access to a faulty address to a non-faulty redundant address. A memory access address is compared to contents of the register and, if a match occurs, the access is redirected to a redundant address. Redirection is provided by redundant control logic that supplies a corrected address to the address decoder, which in turn addresses into a memory array.

Post process operations are performed in operation 514. Post process operations include decoding memory access requests and other post process operations that will be apparent to those skilled in the art. Advantageously, the embodiments of the present invention are capable of detecting weak memory cells via the stress clock signal. The embodiments of the present invention utilize the stress clock signal to perform a high stress BISR upon the ASIC memory during power up or reset of the ASIC.

In one embodiment, optimum placement and utilization of the techniques of the present invention is implemented utilizing a generator. The generator should be generally understood to include one or more generators, each generator can be specifically optimized for a particular task. Such tasks or sub-tasks, for example, can include generating a high stress built-in self-repair system (e.g., as shown in FIG. 2A) to be used with a memory device.

Figure 6A:
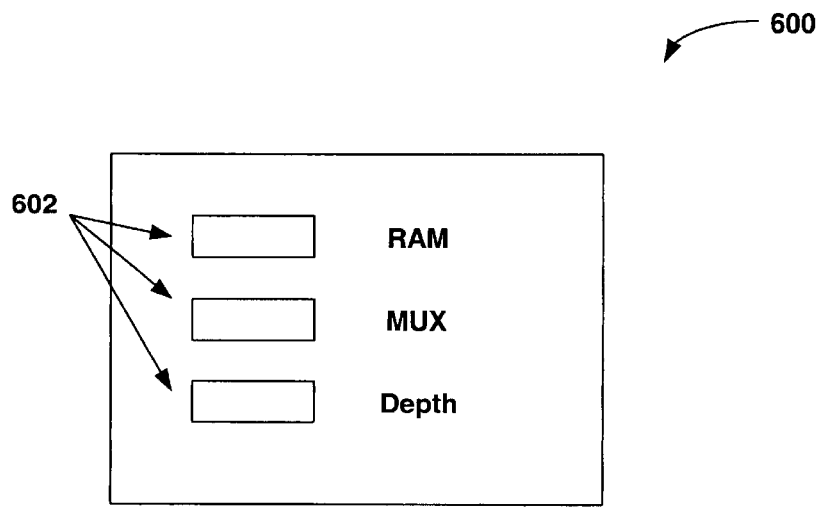
FIG. 6A is a block diagram showing an exemplary simplified memory generator graphical user interface (GUI) front end, in accordance with an embodiment of the present invention.

FIG. 6A is a block diagram showing an exemplary simplified memory generator graphical user interface (GUI) front end 600, in accordance with an embodiment of the present invention. The exemplary memory generator GUI 600 illustrates one view utilized for entering parameters into fields 602 to define a particular memory application. Broadly speaking, the memory generator checks the validity of the entered data and executes appropriate generators to define the memory application. After receiving data utilizing the GUI front end view 600, a memory generator of the embodiments of the present invention processes the data utilizing a memory generator backend, as described next with reference to FIG. 6B.

Figure 6B:
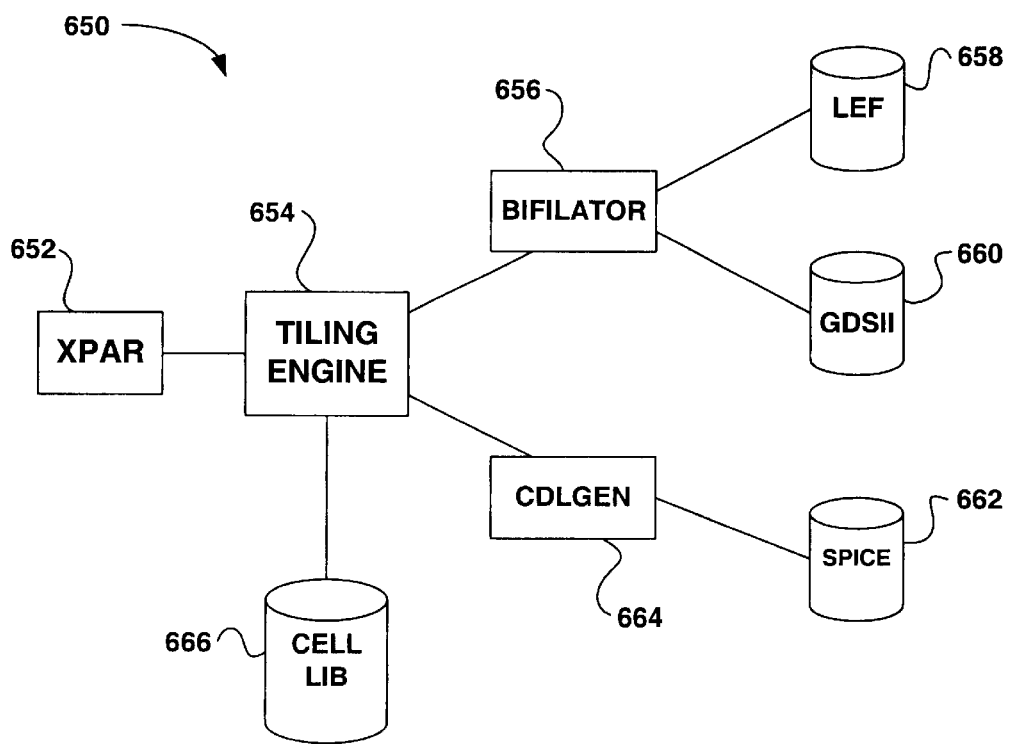
FIG. 6B is a block diagram showing an exemplary memory generator backend, in accordance with an embodiment of the present invention.

FIG. 6B is a block diagram showing an exemplary memory generator backend 650, in accordance with an embodiment of the present invention. The memory generator backend 650 comprises an XPAR process 652, a tiling engine 654, a Bifilator process 656, a CDLGEN process 664, and a cell library 666. Generally speaking, these processes function together to generate a LEF model 658, a GDSII model 660, and a SPICE model 662 for the particular memory application. The LEF model 658 comprises place and route information, which is utilized by routers to manufacture integrated circuits. The GDSII model 660 comprises mask layouts and is utilized by semiconductor foundries. The SPICE model 662 includes circuit interconnection definitions, operational properties, and schematic diagrams of the memory application. Thus, the designer can use the SPICE model of the application for cross verification.

As mentioned above, the exemplary memory generator backend 650 processes the data received via the GUI front end 600. More specifically, the XPAR process 652 encapsulates the rules needed to utilize particular cell layouts stored in the cell library. These rules, along with the parameter data for the memory application are then provided to the tiling engine 654 for optimization and cell placement. By separating the functions of the XPAR process 652 from those of the tiling engine 654, individual rules can be altered for specific applications without altering the functions and placement algorithms utilized in the timing engine 654.

The Bifilator process 656 generates an interface around a particular device or memory array. Generally, on a RAM there may exist over one thousand routing points for interfacing with the RAM. As a result, the entire routing configuration may change when a user changes the placement of the RAM, requiring intense reconfiguration. To address this issue, the Bifilator process 656 builds an interface around the RAM, which the user can use to interface with the RAM without configuring each routing point.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention. By way of example, a VHDL® hardware description language available from EEE of New York, N.Y. may be used to design an appropriate logic circuitry and siliconlevel layout.

The invention may employ various computer-implemented operations involving data stored in computer systems to drive computer peripheral devices (i.e., in the form of software drivers). These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for identifying faulty and weak memory cells, comprising the operations of:
   providing a normal internal clock signal for use in accessing a memory array; and
   performing a test on the memory array using a stress clock signal, wherein each pulse of the stress clock signal is of a shorter duration than each pulse of the normal internal clock signal, wherein memory cells that fail the test using the stress clock signal are identified as non-usable memory cells.

2. A method as recited in claim 1, wherein the non-usable memory cells are recorded in a memory block.

3. A method as recited in claim 1, wherein the memory array includes redundant memory cells that can be accessed during normal operation, and wherein the normal internal clock signal is based on required read and write times for memory cells of the memory array.

4. A method as recited in claim 3, wherein the normal internal clock signal is further based on a margin added to the required read and write times for memory cells of the memory array.

5. A method as recited in claim 4, wherein the margin is derived from expected variations in required read and write times for the memory cells of the memory array.

6. A method as recited in claim 5, wherein each pulse of the stress clock signal is approximately equal to each pulse of the normal internal clock signal minus the margin.

7. A method as recited in claim 6, wherein the stress clock signal is not used during normal memory access operations.

8. A method as recited in claim 7, wherein the normal internal clock signal is used during normal memory access operations.

9. An embedded memory device, comprising:
   a memory array;
   a programmable normal internal clock, the programmable normal internal clock capable of being programmed to generate a stress clock signal, each pulse of the stress clock signal being of a shorter duration than each pulse of a normal internal clock signal used in accessing the memory array; and
   a built-in self-test circuit that performs a built-in self-test using the stress clock signal, whereby extreme operating conditions are simulated by the stress signal.

10. An embedded memory device as recited in claim 9, further comprising a storage that stores defective memory addresses detected by the built-in self-test circuit.

11. An embedded memory device as recited in claim 10, wherein the storage is a register.

12. An embedded memory device as recited in claim 10, further comprising redundant control logic that redirects memory access operations to the defective memory addresses to redundant memory cells.

13. An embedded memory device as recited in claim 12, wherein each pulse of the stress clock signal is approximately equal to each pulse of the normal internal clock signal minus a margin.

14. An embedded memory device as recited in claim 13, wherein the stress clock signal is not used during normal memory access operations, and wherein the normal internal clock signal is used during normal memory access operations.

15. An embedded memory device as recited in claim 9, wherein the embedded memory device is designed using a generator.

16. A method for testing a memory under simulated extreme conditions, comprising the operations of:
    providing an normal internal clock signal for use in accessing a memory array;
    testing the memory array using a stress signal having a pulse width that is shorter than a pulse width of the normal internal clock signal; and
    recording memory cells that fail the test using the stress signal as non-usable memory cells, whereby extreme operating conditions are simulated by the stress signal.

17. A method as recited in claim 16, wherein the normal internal clock signal is based on required read and write times for memory cells of the memory array.

18. A method as recited in claim 17, wherein the normal internal clock signal is further based on a margin added to the required read and write times for memory cells of the memory array.

19. A method as recited in claim 18, wherein the margin is derived from expected variations in required read and write times for the memory cells of the memory array.

20. A method as recited in claim 19, wherein each pulse of the stress clock signal is approximately equal to each pulse of the normal internal clock signal minus the margin.

21. A method as recited in claim 16, wherein the method is performed using a memory device designed using a generator.

* * * * *